(12) United States Patent
Chen et al.

(10) Patent No.: US 10,644,664 B2
(45) Date of Patent: May 5, 2020

(54) OFFSET CANCELLATION SCHEME

(71) Applicant: Texas Instruments Incorporated, Dallas, TX (US)

(72) Inventors: Jikai Chen, Allen, TX (US); Gerd Schuppener, Allen, TX (US); Yanli Fan, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 70 days.

(21) Appl. No.: 15/716,091

(22) Filed: Sep. 26, 2017

(65) Prior Publication Data

US 2019/0097593 A1    Mar. 28, 2019

(51) Int. Cl.
*H03F 3/45* (2006.01)
*H03F 1/26* (2006.01)
*H03F 1/02* (2006.01)

(52) U.S. Cl.
CPC .......... *H03F 3/45748* (2013.01); *H03F 1/26* (2013.01); *H03F 3/456* (2013.01); *H03F 3/45183* (2013.01); *H03F 3/45475* (2013.01); *H03F 3/45479* (2013.01); *H03F 3/45973* (2013.01); *H03F 2200/129* (2013.01); *H03F 2200/135* (2013.01); *H03F 2203/45031* (2013.01); *H03F 2203/45051* (2013.01); *H03F 2203/45056* (2013.01); *H03F 2203/45116* (2013.01); *H03F 2203/45142* (2013.01); *H03F 2203/45212* (2013.01); *H03F 2203/45354* (2013.01); *H03F 2203/45588* (2013.01)

(58) Field of Classification Search
USPC .................................. 330/9, 69, 252–261, 51
See application file for complete search history.

(56) References Cited

U.S. PATENT DOCUMENTS 6,750,703 B1 * 6/2004 Shen ....................... H03F 3/387
327/124

* cited by examiner

*Primary Examiner* — Hieu P Nguyen
(74) *Attorney, Agent, or Firm* — John R. Pessetto; Charles A. Brill; Frank D. Cimino

(57) ABSTRACT

An offset cancellation circuit and method are provided where successive stages of cascaded amplifiers are operated in a saturated state. Biasing is provided, by a feedback amplifier, connected in a feedback loop for each cascaded amplifier, so as to be responsive, in a non-saturated state, to the input of an associated amplifier stage operating in the saturated state.

20 Claims, 5 Drawing Sheets

OFFSET CANCELLATION SCHEME

BACKGROUND

Offset cancellation (OC) is required in multi-stage amplifiers especially when there is a need to process small signals or extract AC signals superimposed on a large DC component (e.g. transimpedance amplifiers in optical communications). A commonly used topology uses an OC amplifier to force the DC component of the main amplifier output to zero. However, mismatch in an OC amplifier may cause the main amplifier to malfunction when the input signal is large and/or the input data rate is low, as some or all of the main amplifier stages limit/saturate.

Differential amplifier offset results from any phenomenon that causes a non-zero output without an input signal being applied to amplifier (amp) input. Typically, such errors are caused by device mismatch, noise, drift, etc. Some multi-stage amplifiers use a differential amp having an offset cancellation feedback loop between the last amplifier stage and the first amplifier stage. However, a large dc offset can often lead to saturation. Additionally, offset problems can intensify with each additional amp stage.

FIG. 1 is a schematic drawing of an offset cancellation scheme illustrating three differential amp stages labeled I, II and III (and serving as the main stages of an overall amplifier), respectively, connected together in series from the output of one to the input of another. Stage IV is shown connected to the output of the scheme which may, for instance, serve as a buffer amplifier. An offset cancellation loop is effected by providing an offset cancellation amplifier connected to and between the output of stage III and the input of stage I. An offset voltage, represented as Vos, is presented at an input of the offset cancellation amplifier OCA. With reference to the dynamic output cancellation scheme of FIG. 1, in connection with an input signal level increase, stage III may begin to saturate/limit. Once the stage III amplifier saturates, the gain of the OC loop, connected to an input of stage I, may drop.

Typically, reducing the value of an amplifier's imperfection as reflected to its input involves making the gain of the amplifier as large as practical. However, fixing component imperfections through transistor sizing mandates larger area and more power. Reducing the mismatch of an OC amplifier mandates more area and power, because the mismatch might decrease by 50% when the size of the OC amplifier increases, for instance, to 400%. This issue is even more pronounced when the input data-rate is low. As a result of these challenges, a better scheme may be useful to deal with offset problems in multi-stage amplifiers. As result, the input-referred offset increases.

SUMMARY

An offset cancellation circuit is provided that has a plurality of amplifier stages cascaded together with the output of the previous amplifier stage being connected to the input of the next stage in the cascade. Further, a feedback loop is provided from the output of each amplifier stage back to the input of a prior amplifier stage with each feedback loop having a feedback amplifier, the feedback amplifier input being connected to an amplifier stage output and a feedback amplifier output being connected to the input of a prior amplifier stage.

The foregoing, and other features and advantages will be apparent from the following, more particular description of the embodiments, the claims and accompanying drawings.

BRIEF DESCRIPTION OF THE DRAWINGS

For a more complete understanding of the present embodiment and advantages thereof, reference is now made to the ensuing descriptions taken in connection with the accompanying drawings briefly described as follows in which applicable reference numerals have been carried forward.

DETAILED DESCRIPTION

An offset cancellation scheme is provided herein, potentially implemented as an apparatus, method and/or system. The offset cancellation scheme may be implemented to provide contributions from each of several stages of an amplifier, for example. Moreover, the offset cancellation scheme may provide benefits that accrue from continued operation or effectiveness when one or more stages of an amplifier enter into a saturation mode, for example. Additionally, the offset cancellation scheme may operate to provide an amplifier more resistant to offsets resulting from variation in manufacturing or environmental factors.

Figure 1:
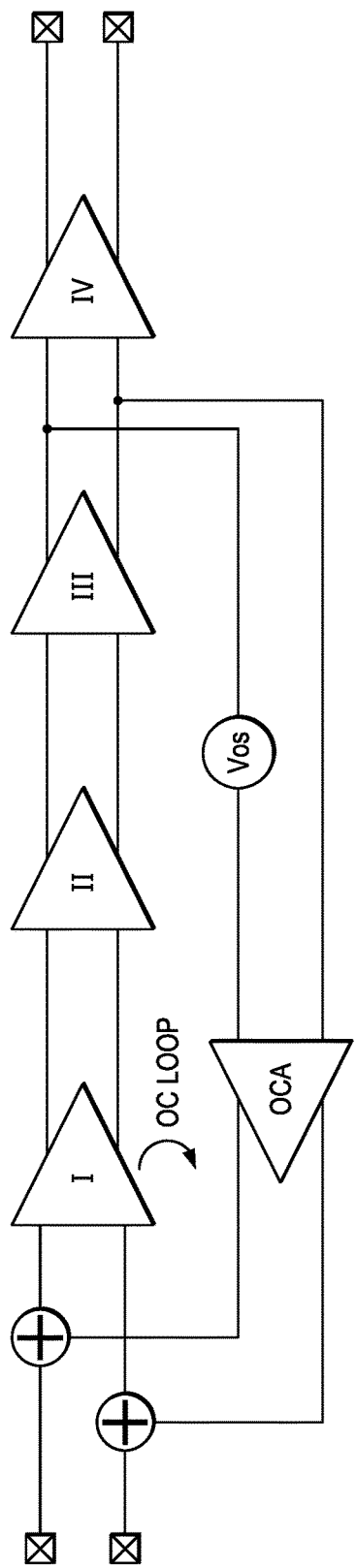
FIG. 1 is a schematic drawing of an offset cancellation scheme illustrating three differential amp stages labeled I, II and III (and serving as the main stages of an overall amplifier), respectively, connected together from the output of one to the input of another.
Figure 2:
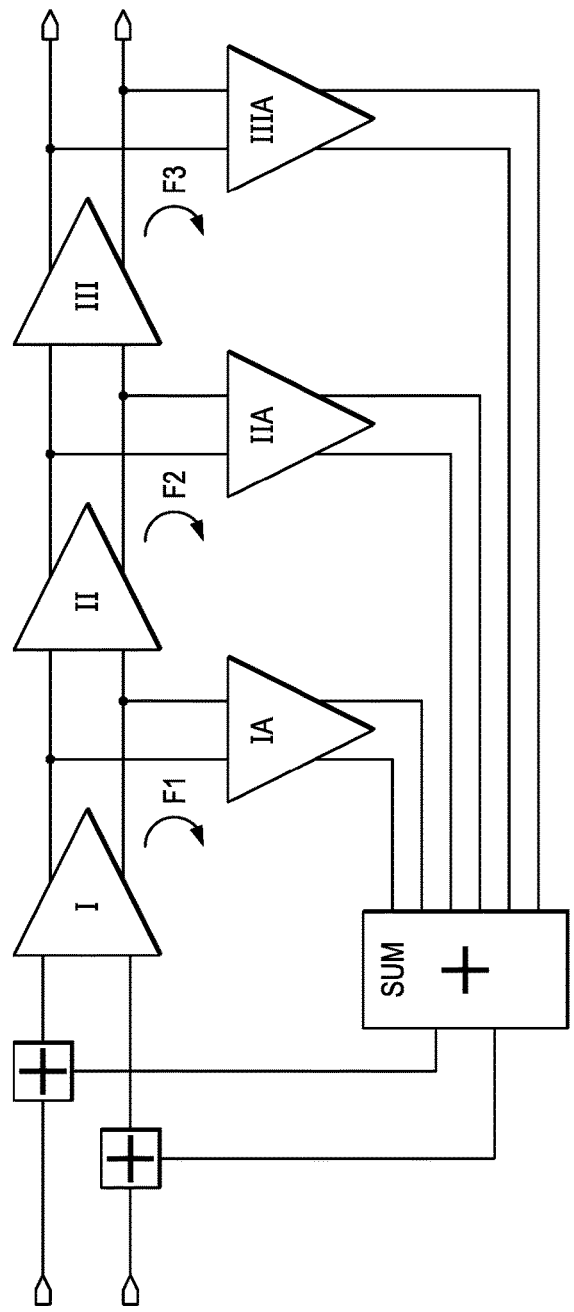
FIG. 2 is a schematic drawing showing an embodiment where three amplifier stages, labeled I, II and III, are connected together with a respective offset cancellation amplifier (labeled IA, IIA, and IIIA) connected to each amplifier output (I, II, and III).

FIG. 2 is a schematic drawing showing an embodiment where three amplifier stages, labeled I, II and III, are connected together with a respective offset cancellation amplifier (labeled IA, IIA, and IIIA) connected to each amplifier output (I, II, and III), (e.g., they are cascaded together). Although only three amplifier stages are shown in FIG. 2 with their respective OC loops, fewer or more stages are contemplated. In addition to a feedback loop from the last stage III to the first stage, F, each stage (IA, IIA, IIIA . . . ) provides an offset cancellation (OC) loop (F1, F2 and F3) from its respective similarly indexed amplifier (I, II, III . . . ) back to an input stage such as the input of stage I.

The outputs from each offset cancellation amplifier sum at summer SUM. As amplifier III is the last among the chain of amplifiers shown, it will receive offset contributions from the previous amplifiers in the chain. Consequently, as the input signal level to the circuit of FIG. 2 increases, amplifier stage IIA, which provides a tap to the input of stage III, serves to provide amplified feedback responsive to the input signal as stage III's contribution to the feedback loop, from stage III to stage I, through offset cancellation amplifier IIIA is lessened. During ensuing operation, should stage II saturate, stage IA provides the primary offset cancellation feedback responsive to the input signal as stage II's contribution to the feedback loop, from stage II to stage I, is lessened. Thusly, rather than having a single feedback loop through an amplifier from output of a last stage to the input of a first stage for a multi-stage amplification scheme, a feedback loop is provided for each amplifier stage among the stages of a multistage amplifier scheme or system. With the foregoing, the offset cancellation loop gain is maintained over a much wider input range and the performance does not depend on the input data rate. As a result of the suppression by the main amplifier gain, the OC amplifier mismatch is rendered nearly irrelevant and minimal or near-minimal size can be used.

Figure 3:
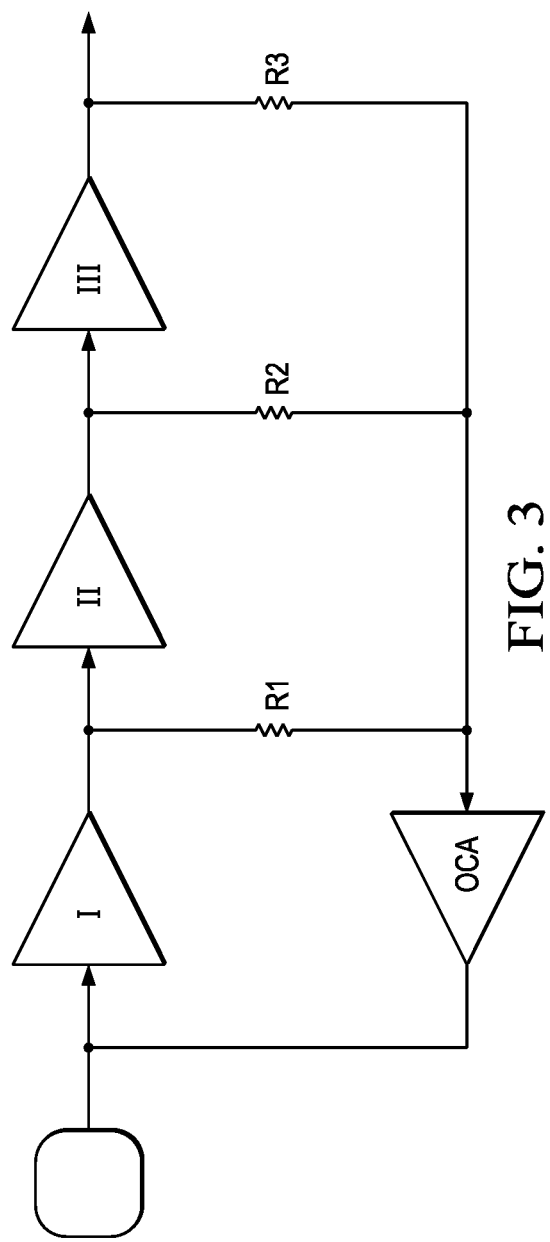
FIG. 3 illustrates such an additional embodiment where a single offset cancellation amplifier, OCA, is placed in a feedback loop between the first and last stages of the multi-staged amplifiers.

Further area and power reduction may be achieved by simply tying each stage output to a big resistor and feeding the combined signal to a single OC amplifier. FIG. 3 illustrates such an additional embodiment where a single offset cancellation amplifier, OCA, is placed in a feedback loop between the first and last stages of the multi-stage amplifiers. A respective resistor, labeled R1 through R3 taps the output of each amplifier stage (I, II, III) and a respective voltage output from each stage is provided to the input of offset cancellation amplifier OCA. The resistors provide respective feedback loops from each stage output back to a prior stage such as the input of stage I as shown in FIG. 3. As with the embodiment in FIG. 2, should stage III go into saturation, the output across stage II, which is fed to the input of the offset cancellation amplifier OC through resistor R2, provides a primary feedback providing offset cancellation as the contribution from the output of stage III diminishes. Should stage II go into saturation, the output across stage I, which is fed to the input of the offset cancellation amplifier OCA through resistor R1, provides a primary feedback providing offset cancellation as the contribution from the output of stage II is lessened. This reduces the contribution of the stage II to the offset cancellation stage OC as compared with stage I.

Figure 4:
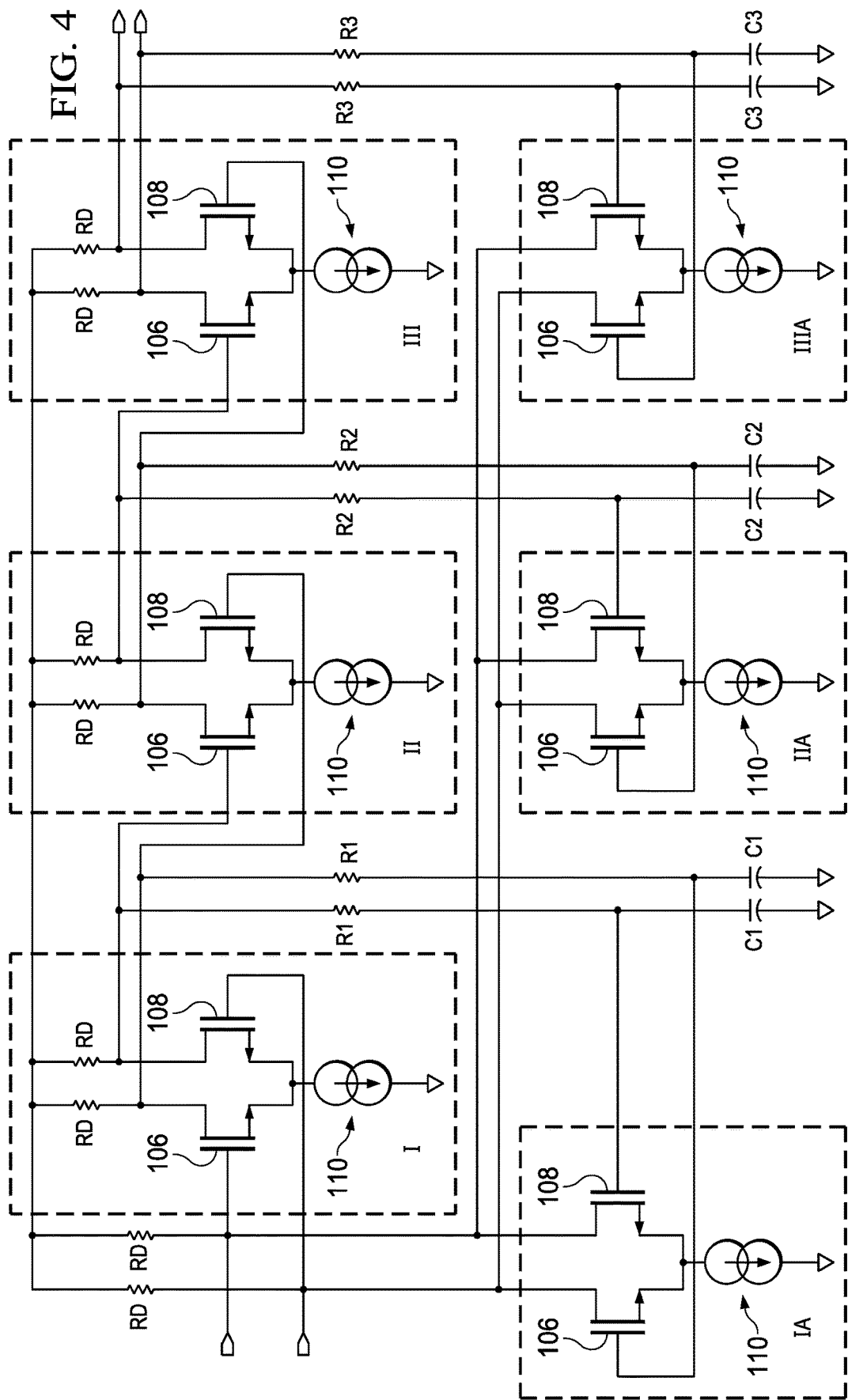
FIG. 4 illustrates a schematic drawing of a transistor-level implementation of one or more of the foregoing described embodiments.

Considering a different level of detail provides further insights into what has been described and illustrated. FIG. 4 illustrates a schematic drawing of a transistor-level implementation of one or more of the foregoing described embodiments. Field effect transistors are illustrated although the foregoing scheme is contemplated as being carried out with bipolar transistors as well. Although devices of a particular polarity or type are shown, devices of the opposite type are also contemplated. As such n-type transistors may be substituted throughout with p-type transistors. Also, n-channel transistors may be substituted with p-channel transistors throughout. In FIG. 4, each amplifier stage, including each offset cancellation amplifier, is shown as including a differential pair of n-channel transistors 106 and 108 connected to current source 110. The drain of each transistor in stages I, II and III is connected to a drain resistor RD. The drains of respective source-coupled transistors in the offset cancellation amplifiers are connected together. Each resistor RD can be connected to a voltage supply source. The drain of each transistor of a differential pair of an associated amplifier stage, is generally connected to the gate of an associated transistor of a differential pair in the next stage of the succeeding amplifier. A pair of resistors, also joins the drains of a respective stage to an associated gate of an associated offset cancellation amplifier. Each such resistor is labeled R1, for the first stage I; each such resistor is labeled R2 for the second stage II; and each such resistor is labeled R3 for the third stage III, respectively. A pair of capacitors, each indexed according to the associated stage (C1, C2 or C3) are also shown connected to an associated drain and to a reference voltage, respectively. C1, C2 and C3 may also be representative of line capacitance in some situations.

With reference to FIG. 4, when stage III begins to enter a state of saturation, transistors 106 and 108 turn on highly and stage III begins to output a voltage difference of about the product of current source 110's current times the resistance of resistor RD. A substantial voltage drop occurs across each resistor R3 and transistors 106 and 108 in stage IIIA. Stage IIA provides offset cancellation feedback back to the input of stage I as stage III becomes saturated. In turn, as stage II becomes saturated, stage IA provides offset cancellation feedback back to the input of stage I.

Figure 5:
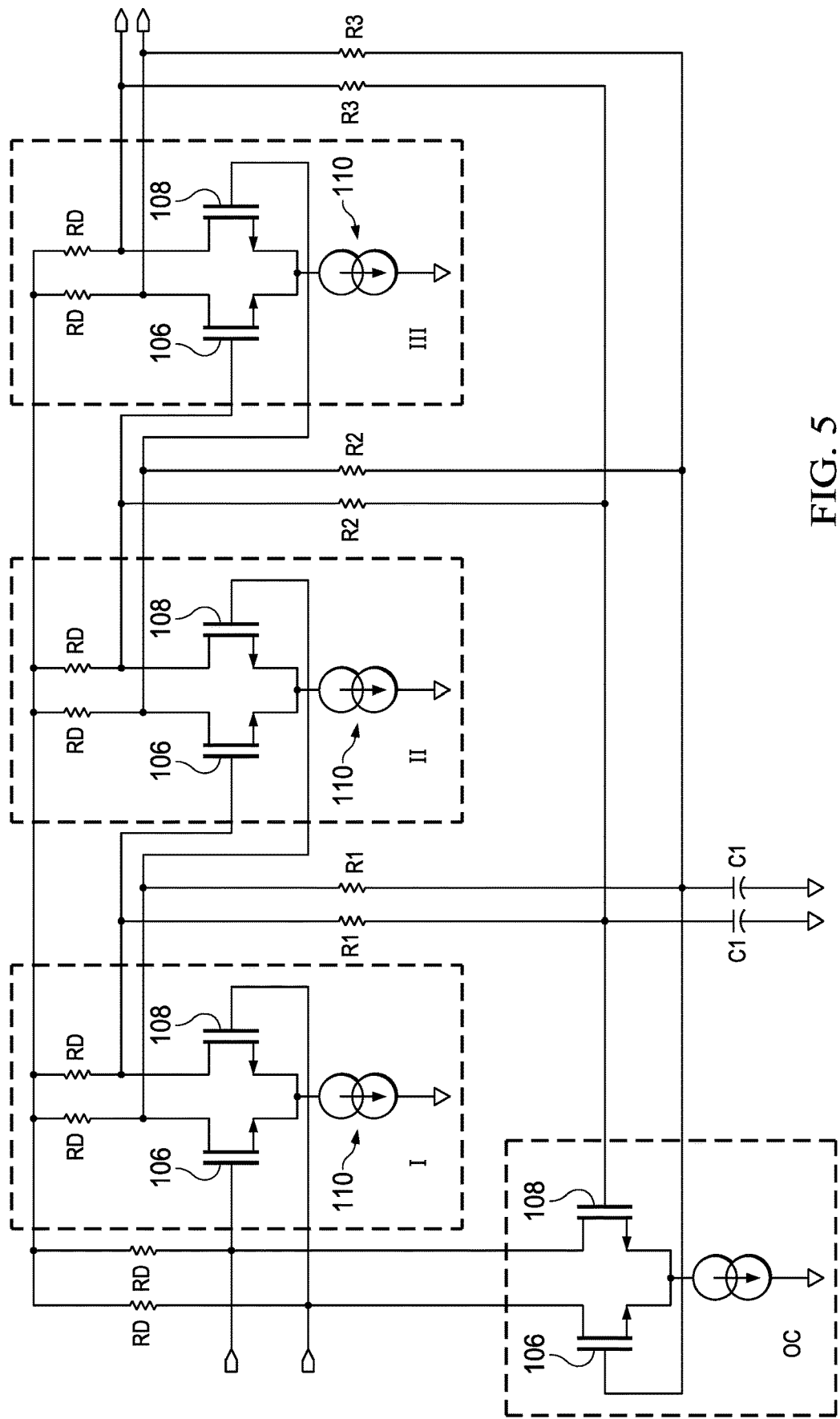
FIG. 5 illustrates a transistor level implementation of one or more of the foregoing described embodiments. The implementation shown in FIG. 5 is simpler than that shown in FIG. 4.

FIG. 5 illustrates a transistor level implementation of one or more of the foregoing described embodiments. The implementation shown in FIG. 5 is simpler than that shown in FIG. 4. Rather than individual stages IA, IIA and IIIA having respective drains tied together, offset cancellation amplifier OC has each gate of a differential amplifier 106 and 108 tied to a respective drain from the amplifier stages I, II and III. This embodiment allows the single offset cancellation amplifier to serve in place of multiple individual offset cancellation amplifiers while providing individual feedback paths to stage I from each amplifier stage.

Figure 6:
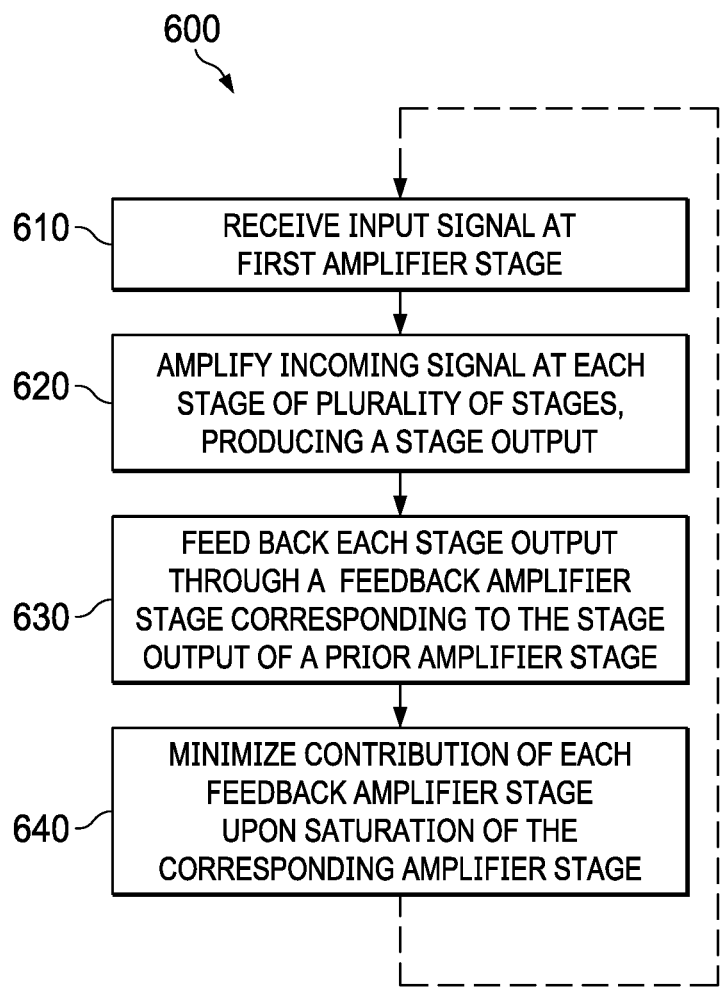
FIG. 6 illustrates a method of operating an offset cancellation scheme.

Various different circuits implementing an offset cancellation scheme as described may implement similar methods. FIG. 6. illustrates a method of operating an offset cancellation scheme. The method 600 starts with receipt of an input signal at a first amplifier stage at step 610. Method 600 proceeds with amplification of the incoming signal at each stage of a plurality of stages, producing a stage output for each stage of the plurality of stages at step 620. Method 600, at step 630, feeds back each stage output through a feedback amplifier corresponding to the stage output (and thus the amplifier stage producing the stage output) of a prior amplifier stage. For instance, each feedback amplifier may ultimately feed back to the first amplifier. At step 640 the method 600 minimizes the contribution of each feedback amplifier responsive to saturation of an amplifier stage corresponding to the feedback amplifier. Each feedback amplifier is biased to amplify signals from an unsaturated corresponding amplifier stage.

The foregoing has been described herein using specific embodiments for the purposes of illustration only. It will be readily apparent to one of ordinary skill in the art, however, that the principles herein can be embodied in other ways. Therefore, this disclosure should not be regarded as being limited in scope to the specific embodiments disclosed herein, but instead as being fully commensurate in scope with the following claims.

We claim:

1. An offset cancellation circuit for a multi-stage differential amplifier, comprising:
    at least three differential amplifier stages (amplifier stages), each with a differential input (input) and a differential output (output), cascaded together with an output of an amplifier stage other than a last amplifier stage connected to an input of a next amplifier stage; and
    at least two offset cancellations loops, each including a respective amplifier stage (collectively, the included amplifier stages), and each coupled from an output of the associated amplifier stage back to the input of a first of the included amplifier stages (the first of the included amplifier stages designated a cancellation amplifier stage), the offset cancellation loops including:

offset cancellation circuitry coupled to receive the differential outputs of the included amplifier stages, and including a differential output (output) coupled to the input of the cancellation amplifier stage, the offset cancellation circuitry configured to cancel offset at the input of the cancellation amplifier stage.

2. The offset cancellation circuit as recited in claim 1 wherein the cancellation amplifier stage is a first amplifier stage of the plurality of amplifier stages.

3. The offset cancellation circuit as recited in claim 1 wherein the number of offset cancellation loops equals the number of amplifier stages.

4. The offset cancellation circuit as recited in claim 1 wherein the offset cancellation circuitry comprises:

a plurality of offset cancellation amplifier circuits, one for each offset cancellation loop;

each offset cancellation amplifier circuit including a differential input (input) coupled to the output of the associated amplifier stage, and a differential output (output) coupled to the input of the cancellation amplifier stage.

5. The offset cancellation circuit as recited in claim 1 wherein the offset cancellation circuitry comprises:

an offset cancellation amplifier circuit including a differential input (input) coupled through a respective resistor to the output of each of the included amplifier stages, and a differential output (output) coupled to the input of the cancellation amplifier stage.

6. The offset cancellation circuit as recited in claim 1 wherein each amplifier stage comprises:

a differential pair of field effect transistors, with the drain of each field effect transistor connected to a gate of an associated field effect transistor of a differential pair in a next differential amplifier stage.

7. The offset cancellation circuit as recited in claim 4 wherein each offset cancellation amplifier circuit comprises a differential pair of field effect transistor.

8. The offset cancellation circuit as recited in claim 5 wherein the offset cancellation amplifier circuit comprises a differential pair of field effect transistors.

9. The offset cancellation circuit as recited in claim 1 wherein each amplifier stage is constructed of transistors consisting of one of bipolar transistors, and field effect transistors (FETs).

10. A multi-stage differential amplifier circuit, comprising:

at least three differential amplifier stages (amplifier stages), each with a differential input (input) and a differential output (output), cascaded together with an output of an amplifier stage other than a last amplifier stage connected to an input of a next amplifier stage; and at least two offset cancellations loops, each including a respective amplifier stage (collectively, the included amplifier stages), and each coupled from an output of the associated amplifier stage to the input of a first of the included amplifier stages (the first of the included amplifier stages designated a cancellation amplifier stage), each offset cancellation loop including:

amplification circuitry coupled to receive the differential outputs of the included amplifier stages, and including a differential input (input) coupled to the output of the associated amplifier stage, and a differential output (output) coupled to the input of the cancellation amplifier stage;

the amplification circuitry configured to cancel offset at the input of the cancellation amplifier stage.

11. The multi-stage amplifier circuit as recited in claim 10 wherein the cancellation amplifier stage is a first amplifier stage of the plurality of amplifier stages.

12. The multi-stage amplifier circuit as recited in claim 10 wherein the number of offset cancellation loops equals the number of amplifier stages.

13. The multi-stage amplifier circuit as recited in claim 10 wherein the amplification circuitry comprises:

a plurality of amplifier circuits, one for each offset cancellation loop;

each amplifier circuit including a differential input (input) coupled to the output of the associated amplifier stage, and a differential output (output) coupled to the input of the cancellation amplifier stage.

14. The multi-stage amplifier circuit as recited in claim 10 wherein the amplification circuitry comprises:

an amplifier circuit including a differential input (input) coupled through a respective resistor to the output of each of the included amplifier stages, and a differential output (output) coupled to the input of the cancellation amplifier stage.

15. The multi-stage amplifier circuit as recited in claim 10 wherein each amplifier stage comprises:

a differential pair of field effect transistors, with the drain of each field effect transistor connected to a gate of an associated field effect transistor of a differential pair in a next differential amplifier stage.

16. The multi-stage amplifier circuit as recited in claim 13 wherein each amplifier circuit comprises a differential pair of field effect transistors.

17. The multi-stage amplifier circuit as recited in claim 14 wherein the amplifier circuit comprises a differential pair of field effect transistors.

18. The multi-stage amplifier circuit as recited in claim 10 wherein each amplifier stage is constructed of transistors consisting of one of bipolar transistors, and field effect transistors (FETs).

19. The multi-stage amplifier circuit as recited in claim 10 wherein the amplification circuitry comprises one of:

a plurality of amplifier circuits, each including a differential input (input) coupled to the output of the associated amplifier stage, and a differential output (output) coupled to the input of the first of the included amplifier stages; and an amplifier circuit including a differential input (input) coupled to the output of each of the included amplifier stages, through a respective resistor, and a differential output (output) coupled to the input of the first of the included amplifier stages.

20. A multi-stage differential amplifier circuit, comprising:

at least three differential amplifier stages (amplifier stages), each with a differential input (input) and a differential output (output), cascaded together with an output of an amplifier stage other than a last amplifier stage connected to an input of a next amplifier stage; and for at least two of the amplifier stages (collectively, the included amplifier stages), amplification circuitry coupled between the differential outputs of each of the included amplifier stages, and the input of a first of the included amplifier stage;

the amplification circuitry including a differential input (input) coupled to the outputs of each of the included amplifier stages, and a differential output (output) coupled to the input of the first of the included amplifier stage.

\* \* \* \* \*